United States Patent [19]

Bindal et al.

[11] Patent Number: 5,264,395
[45] Date of Patent: Nov. 23, 1993

[54] THIN SOI LAYER FOR FULLY DEPLETED FIELD EFFECT TRANSISTORS

[75] Inventors: Ahmet Bindal, Hopewell Junction; Carol Galli; Nivo Rovedo, both of Lagrangeville, all of N.Y.

[73] Assignee: International Business Machines Corporation, Armonk, N.Y.

[21] Appl. No.: 991,221

[22] Filed: Dec. 16, 1992

[51] Int. Cl.$^5$ .................................. H01L 21/465
[52] U.S. Cl. ................................ 437/228; 437/21; 437/61; 437/966
[58] Field of Search ............... 437/21, 61, 974, 966, 437/249, 90, 193, 38, 28, 925, 225, 228

[56] References Cited

U.S. PATENT DOCUMENTS

| | | | |
|---|---|---|---|
| 4,601,779 | 7/1986 | Abernathey et al. | 156/628 |
| 4,671,851 | 6/1987 | Beyer et al. | 156/645 |
| 4,735,679 | 4/1988 | Lasky | 156/636 |
| 4,824,795 | 4/1989 | Blanchard | 437/62 |
| 4,942,137 | 7/1990 | Sivan et al. | 437/63 |
| 5,013,681 | 5/1991 | Godbey et al. | 437/86 |
| 5,024,723 | 6/1991 | Goesele et al. | 156/628 |
| 5,032,544 | 7/1991 | Ito et al. | 437/228 |
| 5,051,378 | 9/1991 | Yagi et al. | 437/225 |
| 5,064,683 | 11/1991 | Poon et al. | 427/39 |
| 5,071,792 | 12/1991 | VanVonno et al. | 437/227 |
| 5,086,011 | 2/1992 | Shiota | 437/61 |
| 5,162,254 | 11/1992 | Usui et al. | 437/63 |

Primary Examiner—Olik Chaudhuri
Assistant Examiner—H. Jey Tsai

[57] ABSTRACT

A method of forming a SOI integrated circuit includes defining thin silicon mesas by etching a device layer down to the underlying insulator, forming a nitride bottom polish stop in the bottom of the apertures by a low temperature PECVD process, with nitride sidewalls on the silicon mesas being susceptible to easy removal, so that no hard material is present during a chemical-mechanical polishing step to thin the device layer down to less than 1000Å, and filling the apertures with a temporary layer of polysilicon to provide mechanical support to the edges of the device layer during the polishing operation.

8 Claims, 3 Drawing Sheets

THIN SOI LAYER FOR FULLY DEPLETED FIELD EFFECT TRANSISTORS

TECHNICAL FIELD

The field of the invention is that of silicon on insulator (SOI) integrated circuits in which transistors are formed in a thin device layer of silicon above an underlying insulating layer of buried oxide.

BACKGROUND ART

Extensive work has been done in the field of silicon on insulator (SOI) integrated circuits, in which two wafers of silicon are bonded together with an oxide layer in between. One of the two wafers is ground or otherwise thinned down to the desired thickness. Commercially available wafers have a top silicon device layer having a nominal thickness of $2\mu m \pm 0.3\mu m$. The art has long sought the development of a device layer of thinner dimensions in order to reduce capacitance in the final devices and also to produce fully depleted CMOS field effect transistors, which, for standard voltages and doping concentrations, require a device layer of thickness less than 1000Å.

Thin device layers made by implanting oxygen and forming the buried oxide insulating layer in situ (SIMOX) are commercially available, but the top surface of the buried insulator has crystal defects that produce leaky devices.

U.S. Pat. No. 4,735,679 illustrates a technique for providing thin uniform layers of top silicon, called device silicon, above an underlying oxide insulator to form SOI integrated circuits. This patent illustrates a technique in which a polish stop of refractory metal, defined by a lift off technique, is used to define the uniformity of the silicon device layer.

SUMMARY OF THE INVENTION

The invention relates to a method for forming thin islands or mesas of SOI with thickness in the range of 500 to 1000Å, in which manufacturability is improved by the easy removal of nitride sidewalls of a polish stop layer, thereby facilitating the separation and definition of polish stops in a controllable manner.

A feature of the invention is the provision of vertical sides of apertures in the initial silicon layer that are free of sidewalls of durable material, with the result that superior uniformity of the silicon islands is provided.

Another feature of the invention is the use of low temperature deposition of the polish stop layer to provide sidewalls adapted to easy removal.

BEST MODE OF CARRYING OUT THE INVENTION

Figure 1:
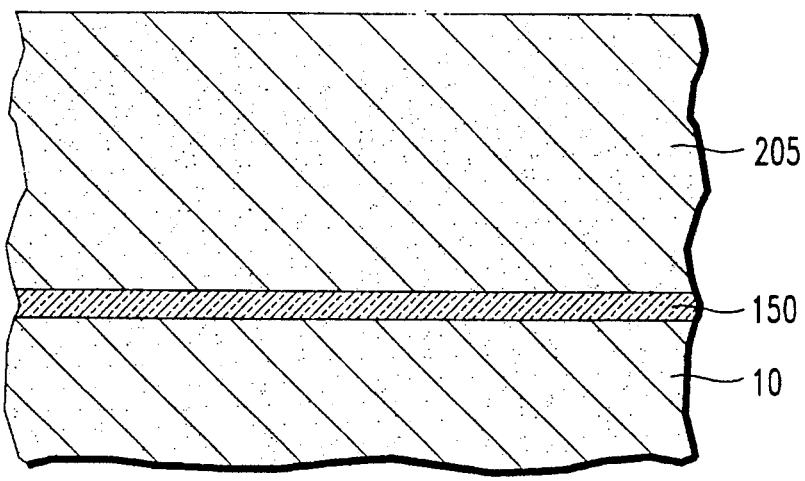
FIGS. 1 through 9 illustrate various steps in the inventive process.

Referring now to FIG. 1, there is shown a cross-section of a bonded SOI wafer in which substrate 10, shown with a broken line to indicate that it extends substantially downward from the center of the drawing, is the lower support wafer having a nominal thickness of 20 mils. Buried oxide layer 150 is a conventional silicon oxide layer that provides the insulating layer in the SOI circuit and also bonds layers 10 and 205. Top layer 205 is the silicon device layer, having a nominal thickness of $2\mu m \pm 0.3$ $\mu m$ as is commercially available. Wafers of this type are commercially available from SEH, Inc. of Japan. The top layer 205 is reduced in thickness by one or more oxidizing steps until it has a nominal thickness of $1 \mu m \pm 0.3$ $\mu m$ as shown in FIG. 2.

Figure 2:
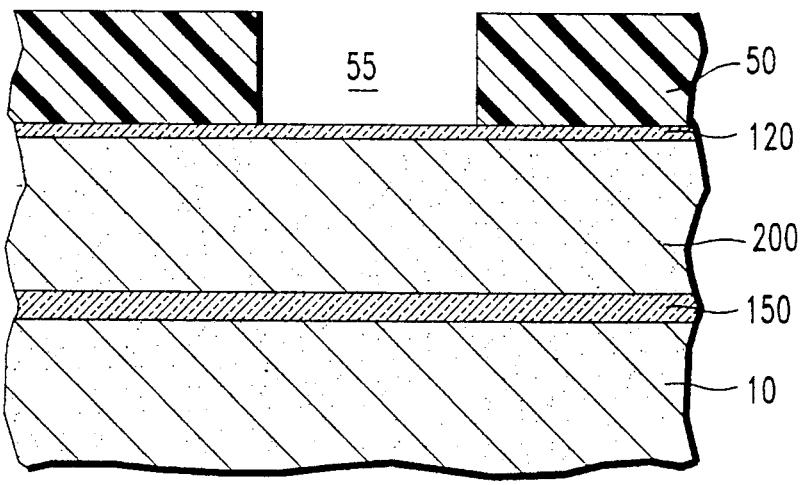

In the center of FIG. 2 there is an aperture 55 in photoresist layer 50. In the next step, aperture 55 will be extended downwardly through layer 200, cutting through protective oxide 120 and device silicon layer 200, to stop on the insulating layer 150. The process is a conventional reactive ion etch process using $CF_4$, $CHF_3$ in Ar for cutting layer 120 and HBr and $Cl_2$ with end point detect for cutting layer 200, followed by HBr, $Cl_2$ with He—$O_2$ for an overetch, as is well known in the art. An advantage of this process is that layer 150 provides a good etch stop.

Figure 3:
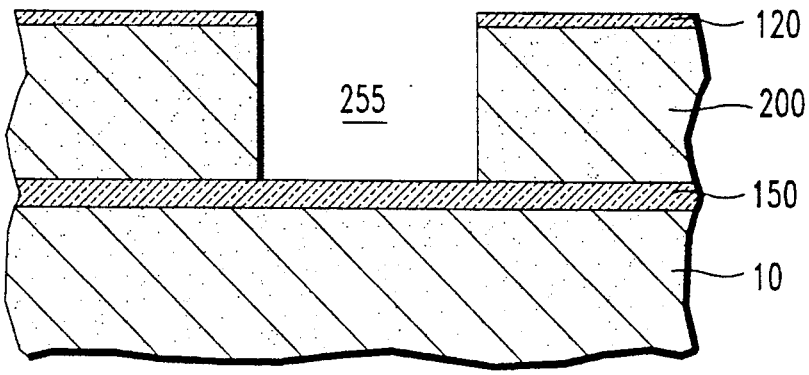

Referring now to FIG. 3, the same area is shown after the etching process. It is important that the sidewalls of aperture 255 be vertical, as shown. In the '679 patent, etching of the photoresist may result in forming slanted sidewalls of silicon mesas which makes "lift off" processing of the polish stop layer more difficult and uncontrollable for manufacturing. In addition, the use of a refractory metal as the polish stop raises the danger that the metal will penetrate, by diffusion or through cracks in the protective oxide layer on the sides of the silicon mesas, contaminating the device layer. Further, the metal was removed at the end of the process, leaving a final surface that was not planar.

Figure 4:
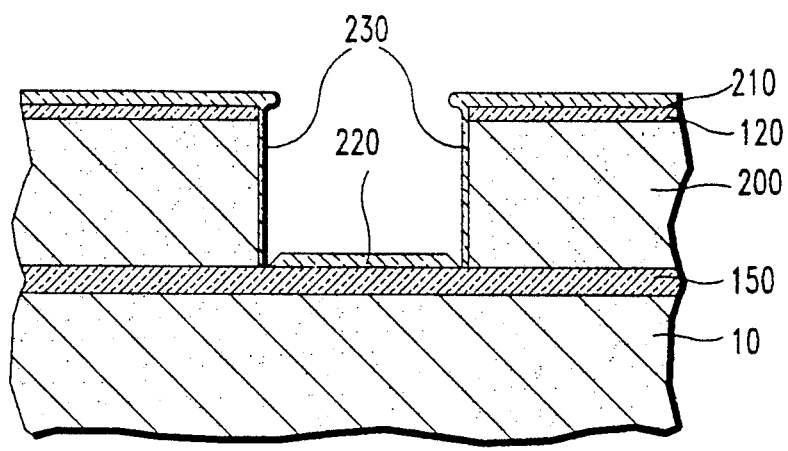

In the next step, as shown in FIG. 4, a layer of plasma enhanced chemical vapor deposited (PECVD) silicon nitride has been deposited at a temperature of less than 300° C. and preferably 100° C. In this temperature range, the nitride layer is deposited in a non-conformal fashion so that the thickness of top layers 210 and bottom layer 220 is a nominal 1000Å, but the thickness of side layers 230 that adhere to the silicon mesa sidewalls is very much less, having a nominal thickness of 200Å. Further, with this deposition technique the sidewalls 230 are much less resistant to attack by BHF because they are not toughened by the effects of radiation from the plasma, which is perpendicular to the wafer during deposition. In the next step, sidewalls 230 are removed by application of 7:1 BHF for 15 seconds. Since bottom layer 220 is much tougher than the sidewalls 230, it is substantially unaffected by the sidewall removal. If the two had the same degree of resistance, the precision of the polish stop layer would be destroyed during the sidewall removal, as is the case in the prior art.

Figure 5:
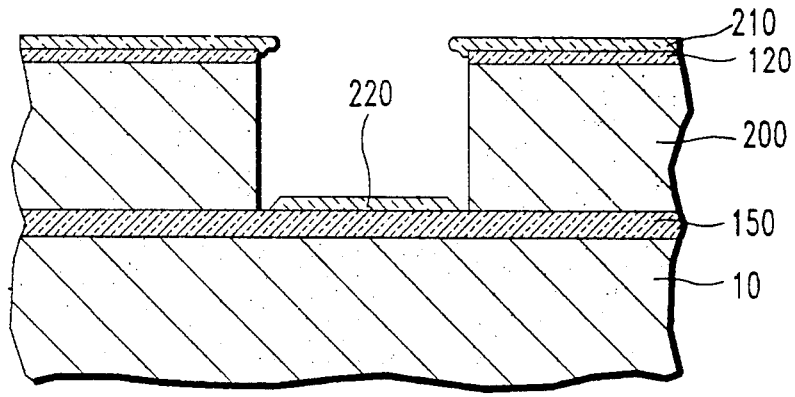
Figure 6:
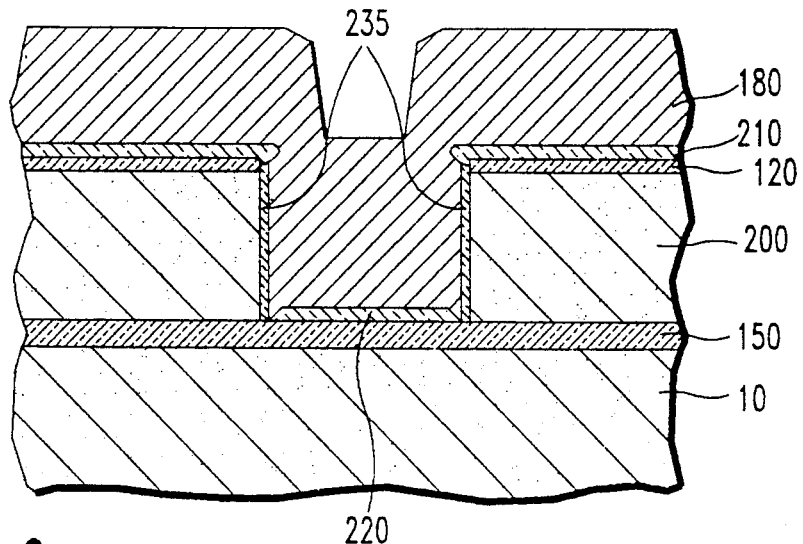

The remaining area is shown in FIG. 5, with thermal oxide protective sidewalls 235 having a nominal thickness of 75Å-100Å. Since the removal of nitride sidewalls 230 has exposed the vertical silicon wall of layer 200, sidewalls 235 extend all the way to layer 150, leaving two gaps that will be filled with polysilicon in a subsequent step. The function of oxide sidewalls 235 is the protection of the final silicon mesas from dopants or contaminants in this intermediate layer of polysilicon, to be described below, that may open a leakage path between source and drain along the edge of the silicon mesa.

An intermediate polysilicon layer 180 is deposited to fill aperture 255, extending over main polish stop layer 210. It is not necessary that the polysilicon layer fill the entire aperture, as will be described below. The function of layer 180 is to protect the edges of layer 200 in apertures 255 during the chemical-mechanical polishing operation that removes layer 200 down to the level of bottom polish stops 220. It has been found that mechanical support for the edges of aperture 255 is beneficial because unsupported edges propagate damage down into the lower parts of layer 200 and into the portion of layer 200 that will be in the final mesas for device fabrication. Preferably, the entire aperture 255 is filled, but that is not essential. Damage at the top of layer 200 does not matter, so long as it is separated from the top surface of stops 220 by a great enough margin that the damage does not reach down into the final mesas.

Figure 7:
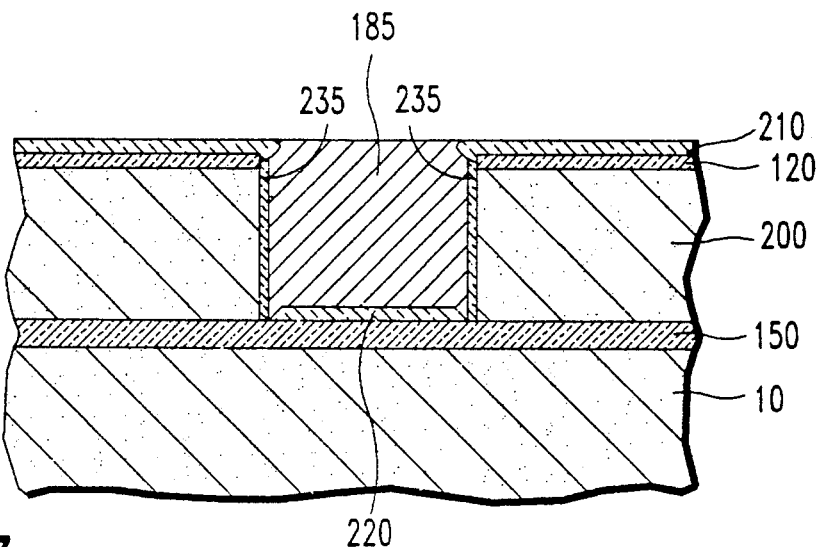
Figure 8:
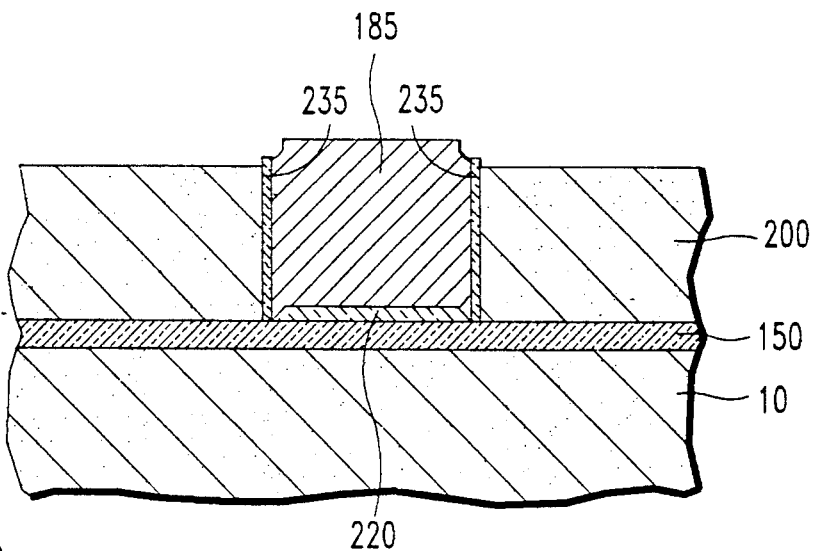
Figure 9:
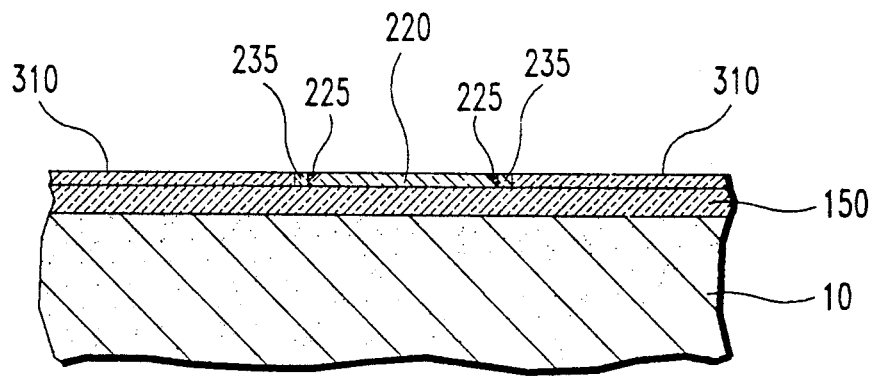

In a first chemical-mechanical polishing operation, layer 180 is polished down using layers 210, which extend over the entire surface of the wafer except for the apertures 255, as a polish stop, referred to for convenience as the main polish stop. The chemical-mechanical polishing operation is conventional, well known to those skilled in the art. The result is shown in FIG. 7. Layers 210 and 120 are then stripped, using conventional wet etch techniques (hot $H_3PO_4$ to strip layer 210 and 7:1 BHF for 15 seconds to remove layer 120), leaving the area shown as FIG. 8. A second polishing operation is used, using layers or plugs 220 as polish stops. The result is shown in FIG. 9 with a pair of mesas 310 between which is located plug 220 bracketed by two small areas 225 which are the remnants of polysilicon layer 180.

The polish stops are spaced throughout the integrated circuit wafer, forming a network of areas that define silicon mesas in between the polish stops. The spacing of the polish stops will be set as is known in the art to provide sufficient polish resistance so that mesas 310 are not "dished" and have a uniform thickness. Those skilled in the art will appreciate that there may be a silicon mesa 310 for each transistor, surrounded by an area of nitride 220 isolated from the silicon mesas by a grown oxide layer 235 (preferred); that there may be a set of large mesas in which transistors are isolated from one another by any convenient means; or any configuration between these extremes.

The uniformity of the silicon mesas 310 is that of plugs 220, which in turn are set by the degree of precision in the nitride deposition process. With the parameters illustrated, the thickness of plugs 220 has a nominal tolerance of $\pm 50 Å$, giving a very highly controlled and highly uniform thickness of mesas 310.

Those skilled in the art will readily appreciate that various embodiments of the invention illustrated herein may be devised, and the scope of the following claims is not intended to be limited to the embodiment illustrated.

We claim:

1. In the formation of an integrated circuit, a method of forming a plurality of thin device mesas of silicon within said integrated circuit in a silicon device layer above an underlying insulator layer on a SOI wafer, comprising the steps of:
   forming a protective layer of oxide on said silicon device layer;
   cutting a plurality of polish stop apertures separated by separation distances such that a final mesa surface will be coplanar with a polish stop top surface, said polish stop apertures having vertical walls, down through said protective layer of oxide and said silicon device layer to said underlying insulator layer;
   depositing a layer of PECVD nitride at a wafer temperature of less than 300° C., leaving thin vertical nitride sidewalls on said vertical walls, a layer of nitride polish stops of a selected polish stop thickness in the bottoms of said apertures and a main polish stop layer outside said apertures above said protective layer of oxide, whereby said nitride polish stops and said main polish stop layer have considerably greater resistance to chemical attach than said nitride sidewalls;
   removing said thin nitride sidewalls down to said underlying insulator layer by an isotropic etch step in which said polish stops are exposed, thereby defining said polish stops in a self-aligned manner;
   growing a layer of thermal oxide on said vertical walls, thereby leaving at least one gap between a bottom nitride polish stop and one of said vertical walls;
   depositing a layer of polysilicon to a selected height in said aperture, thereby filling said at least one gap;
   polishing said polysilicon layer down to said main polish stop layer;
   stripping said main polish stop layer and said protective oxide layer; and
   polishing said silicon device layer and said polysilicon layer until said bottom nitride polish stop is reached, whereby said polysilicon layer provides mechanical support to said vertical walls and a plurality of silicon mesas has a top surface coplanar with said bottom polish stops.

2. A method according to claim 1, in which said step of filling said apertures with polysilicon is continued until said apertures are completely filled.

3. A method according to claim 1, in which said bottom polish stops are less than 1000Å thick.

4. A method according to claim 3, in which said layer of thermal oxide is less than 100Å thick.

5. A method according to claim 1, in which said step of filling said apertures with polysilicon is continued until said apertures are filled to a predetermined thickness sufficient to prevent propagation of mechanical damage down to the level of said bottom polish stops, but said apertures are not completely filled.

6. A method according to claim 5, in which said bottom polish stops are less than 1000Å thick.

7. A method according to claim 6, in which said layer of thermal oxide is less than 100Å thick.

8. A method according to either of claims 1 or 5, in which said step of cutting said plurality of apertures defines a plurality of silicon mesas adapted to hold a single CMOS transistor, each of said plurality of silicon areas being surrounded by a bottom polish stop and isolated from said bottom polish stop by said layer of thermal oxide.

* * * * *